United States Patent [19]

Wong et al.

[11] Patent Number: 5,160,550

[45] Date of Patent: * Nov. 3, 1992

[54] SUPERCONDUCTOR AND PROCESS OF MANUFACTURE

[75] Inventors: James Wong, Wayland; Mark K. Rudziak, Westminster, both of Mass.

[73] Assignee: Composite Materials Technology, Inc., Shrewsbury, Mass.

[ * ] Notice: The portion of the term of this patent subsequent to Oct. 27, 2009 has been disclaimed.

[21] Appl. No.: 560,163

[22] Filed: Jul. 31, 1990

Related U.S. Application Data

[63] Continuation-in-part of Ser. No. 480,236, Feb. 15, 1990, and a continuation-in-part of Ser. No. 540,193, Jun. 19, 1990, and a continuation-in-part of Ser. No. 363,634, Jun. 8, 1989, Pat. No. 4,925,741.

[51] Int. Cl.$^5$ .................. C22C 1/18; H01L 39/12; H01L 39/24; H01B 12/02
[52] U.S. Cl. ........................... 148/96; 29/599; 428/661; 428/930; 505/814; 505/918; 505/921
[58] Field of Search ............ 428/930, 660, 661, 610, 428/614, 662; 148/11.5 Q, 11.5 F; 29/599; 505/1, 812, 813, 919, 921, 814, 918

[56] References Cited

U.S. PATENT DOCUMENTS

| | | | |
|---|---|---|---|
| 3,465,430 | 9/1969 | Barber et al. | 29/599 |
| 3,534,459 | 10/1970 | Kudo et al. | 29/599 |
| 3,625,662 | 12/1971 | Roberts et al. | 428/610 |
| 3,652,967 | 3/1972 | Tomaka et al. | 505/879 |
| 3,665,595 | 5/1972 | Tanaka et al. | 29/599 |
| 3,728,165 | 4/1973 | Howlett | 148/127 |
| 4,803,310 | 2/1989 | Zeitlin et al. | 174/125.1 |
| 4,959,279 | 9/1990 | Tanaka et al. | 428/660 |
| 4,973,527 | 11/1990 | Smathers | 148/11.5 Q |

FOREIGN PATENT DOCUMENTS 45584 2/1982 European Pat. Off. ............ 428/930

OTHER PUBLICATIONS

"Properties of Superconducting NbTi Superfine Filament Composites with Diameters <0.1 μm", I. Hlasnik et al., Apr. 1985, Electrotechnical Institute, Electro--Physical Research Centre, Slovak Academy of Sciences, Bratislava, Czechoslovakia.

"Current-Carrying Capacity of Superconductors with Artificial Pinning Centers", G. L. Dorofejev, E. Yu. Klimenko S.V. Frolov, Kurchatov Inst. of Atomic Energy, Moscow, USSR.

"Restricted Novel Heat Treatments for Obtaining High $J_c$IN Nb 46.5 wt % Ti", P. J. Lee, J. C. McKinnell and D. C. Larbalestier, App. Superconductivity Ctr. Univ. Wisconsin.

"NbTi Superconductors with Artificial Pinning Structures", Supercollider, 2, Plenum Press, N.Y., 1990, pp. 341–348, L. R. Motowidlo, P. Valaris, H. C. Kanithi, M. S. Walker and B. A. Zeitlin, IGC Advanced Superconductors, Inc., 1875 Thomaston Ave., Waterbury, Conn. 06704.

"Innovations in the Design of Multifilamentary NbTi Superconducting Composites for the Supercollider", E. Gregory et al., Supercon. Inc., 830 Boston Turnpike, Shrewsbury, Mass. 01545.

Primary Examiner—John Zimmerman
Attorney, Agent, or Firm—Hayes, Soloway, Hennessey & Hage

[57] ABSTRACT

A method for producing a superconductor includes the steps of combining a plurality of metal bodies to form a composite structure, metal bodies being selected from transition metals such as niobium, tantalum, titanium, zirconium, hafnium and vanadium, alternate bodies being formed of different transition metals to form triplets. The transition metals are reacted to form a ductile superconducting ternary alloy at the interfaces of these triplets of metals. The extent of the reaction is limited so as to maintain areas of pure or nearly pure transition metal along with the superconducting ternary alloy in at least one of each triplet of transition metals.

7 Claims, 1 Drawing Sheet

- COPPER CAN
- .03" THICK Nb BARRIER
- NINE WRAPS:
  .020" Nb + .002" Ta +
  .016" Ti + .002" Ta
- .86" DIAMETER Nb46.5wt%Ti CORE

SUPERCONDUCTOR AND PROCESS OF MANUFACTURE

This invention relates to the production of improved superconductors. This application is a continuation-in-part of our co-pending application Ser. Nos. 07/480,236 filed Feb. 15, 1990, and 07/540,193 filed Jun. 19, 1990, and 07/363,634 filed Jun. 8, 1989, now U.S. Pat. No. 4,925,7. The disclosures of said parent applications is incorporated herein in their entirety.

BACKGROUND OF THE INVENTION

In a preferred form of the invention described in the parent applications, a superconductor is produced by the steps of combining a plurality of layers of metal sheets to form a composite structure. The sheets are preferably pure transition metals—niobium, titanium, zirconium, or vanadium, alternate sheets being formed of different transition metals. The resulting composite structure is mechanically reduced sufficiently so that each transition metal sheet is less than 1000Å thick. In the course of reduction, the composite is subjected to sufficient temperatures for sufficient times such that the transition metal layers are partially reacted to form a ductile superconducting material between the transition metal layers. Approximately one half by volume of the transition metal layers remain unreacted. These unreacted layers afford efficient flux pinning within the composite when the layers are reduced to the <1000Å final size. In other embodiments, powders and filaments can be used instead of initial layers.

BRIEF SUMMARY OF THE INVENTION

The examples specifically given in the parent applications focus on binary alloys of the transition metals, but the same principles can be applied to systems involving more than two transition metals. Alloys composed of more than two metals frequently offer significant advantages over binary alloys like NbTi. NbTiTa, for example, has been shown to have higher critical current densities at 1.8K. than conventional Nb46.5Ti through its full magnetic field range (see 'Innovations in the Design of Multifilamentary NbTi Superconducting Composites for the Supercollider and Other Applications', E. Gregory, T. S. Kreilick, and J. Wong, *Supercollider I*, Plenum Press, 1989). This behavior makes NbTiTa preferable to NbTi in low temperature, high field applications. Other alloys involving multiple transition metals offer different advantages. Unfortunately, these alloys are usually expensive to fabricate and processing them into wire form by conventional means is often difficult, if not impossible. The application of the invention to NbTiTa and other alloys composed of more than two transition metals greatly reduces the cost and improves the fabricability of superconducting wires incorporating them. In addition, the ability to use more than two transition metals allows a degree of flexibility in the design of artificially pinned superconducting composites that is not available in simpler, two component systems.

In order to more fully understand the invention, reference should be had to the following detailed description taken in conjunction with the attached drawing, wherein:

DETAILED DESCRIPTION OF THE INVENTION

Figure 1:
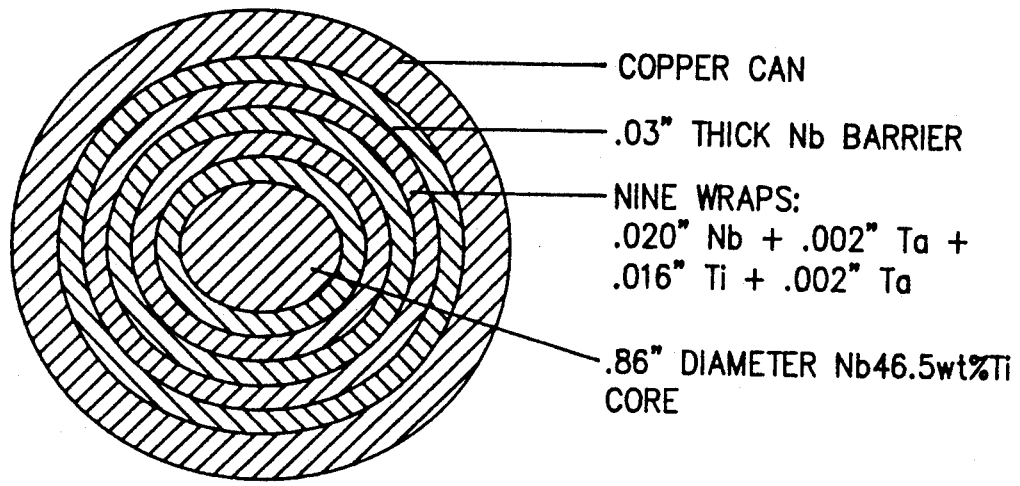
FIG. 1 shows the design of a monofilament billet containing alternating layers of Nb, Ta and Ti sheet wrapped around a Nb46.5%Ti core.

In a preferred form of the present invention, sheets of pure transition metal are layered and then wrapped around a core. When this material is processed, small layer thicknesses are quickly and easily obtained. During processing, ductile superconducting material is formed at the interfaces of the layered sheets such that approximately one half of the sheet thicknesses remain unreacted. These unreacted layers of transition metal afford pinning within the composite when reduced to <1000Å thick. The presence of pinning sites in the composite allows the development of superior $J_c$ at low magnetic field (1T-5T). Here, a pinning site is defined as an interface between normal and superconducting material. In general, the greater the pinning site density within the composite, the better the low field $J_c$.

The thickness of the normal and superconducting layers is critical to the ultimate performance of the composite. If the layer thicknesses are too large, i.e., not on the order of the fluxoid spacing at the particular magnetic field, then inefficient pinning results. On the other hand, if the layers are reduced too much, mechanical and diffusional problems are introduced, as are proximity effects, serving to degrade the critical current density and upper critical field of the composite.

A NbTiTa alloy can be produced in a conductor by the methods described in Example I for NbTi of the parent applications only difference in fabrication is that a 0.002" thick layer of annealed Ta sheet is inserted between the layers of Nb and Ti in the monofilament. The layered structure of Nb, Ta, and Ti can be created by coiling an assembly of four sheets around the core: 0.020"Nb+0.002"Ta+0.016"Ti+0.002"Ta. This arrangement ensures that, the Nb and Ti are never in direct contact. Once the monofilament is assembled, processing continues exactly as described in Example 1 of the parent applications.

According to the invention, a composite material utilizing alternating layers of transition metal can be fabricated as described in the following non-limiting example:

EXAMPLE I

The process begins by constructing a copper clad monofilament billet containing alternating layers of Nb, Ta and Ti around a Nb46.5wt. % Ti core (see FIG. 1). Nb, Ta and Ti layers are utilized so that the alloy NbTaTi is formed via the reaction of the layers during processing. The layer thicknesses are chosen so that after this reaction, thin layers of unreacted Nb and Ti will remain to act as pinning sites, while the rest of the material is NbTaTi alloy. These considerations result in a Nb to Ti to Ta ratio of 10:8:1 by volume.

After assembly, the monofilament billet is electron-beamed welded shut in vacuum and then hot isostatically pressed at 650° C. for four hours at a pressure of 15 ksi. The billet is then machined to 2.0" in diameter for extrusion. Prior to extrusion, the billet is heated to 650° C., which temperature is maintained for two hours. The billet is then extruded at 650° C. to 0.5" in diameter. The extruded rod is cold-drawn to 0.03" in diameter, at which point the copper jacket is removed and the material is restacked in a Nb lined copper can, the Nb here, as in the case of the monofilament, serving to prevent copper contamination of the material. The new billet thus produced contains almost 4000 filaments within a thin Nb matrix.

The restack billet is processed in just the same way as is the monofilament billet, ultimately being drawn to approximately 0.0085" in diameter, where the Nb and Ti layers are less than 500Å in thickness, a size at which these layers operate as flux pinning sites within the composite.

Because the Ta layer is thin relative to the Nb and Ti, the processing results in complete diffusion of the Nb and Ti across the Ta. The final composite thus contains layers of NbTiTa separated by unreacted regions of Nb and Ti that serve as pinning layers Approximately half of the Nb and half of the Ti by volume are reacted with the Ta, producing an average composition near Nb23wt. % Ti34wt. % Ta, although strong compositional gradients are, of course, present.

This processing scheme can be varied in several ways, all of which are in accordance with the invention. The variations arise primarily from two considerations-layer thicknesses and layer sequencing. These factors impact the multiple transition metal composite as follows:

1. It is not important which, or how many of the constituent transition metal layers are made relatively thin, provided that at least one metal is maintained in a nearly pure state to provide flux pinning in the composite. In the composite described above, any two of the layers Nb, Ti, and Ta could be made relatively thin so as to be completely consumed in the diffusion process.

2. In some cases, it may be desirable to utilize thick layers of all the constituent metals in order to produce a composite containing layers of several different binary superconducting alloys rather than a ternary (or higher order) alloy. If a layer of Ta as thick as the Nb were used in the composite described above, the processing would result in incomplete diffusion across the Ta and the composite would thus be threaded with layers of NbTa and TiTa, both of which are superconductors.

3. Changing the order of the constituent layers can result in a fundamentally different composite. In the above composite, if the sequence Ta+Nb+Ti+Ta were utilized instead of Nb+Ta+Ti+Ta, binary NbTi would be formed, while NbTiTa might not be formed at all due to the doubling of the Ta. Clearly, the resulting composite would be very different from that produced by the original sequence.

4. Among the possible variations on the Example I composite, one that contains layers of NbTi and NbTiTa is of particular interest, since both of these alloys are excellent superconductors. Such a composte can be fabricated by wrapping the following assembly of sheets around the NbTi core in the monofilament: 0.020"Nb+0.002"Ti+0.002"Ta+0.016"Ti. Processing then proceeds exactly as described in Example I, above. The diffusion results in the formation of NbTiTa in the region of the thin Ti and Ta, while NbTi is formed at the interface of the Nb and the Ti. Approximately one half by volume of each Nb and each thick Ti layer remains unreacted to ensure flux pinning within the composite. The NbTiTa composition is thus near Nb27wt. % Ti33wt. % Ta, while the NbTi composition is approximately Nb30wt. % Ti.

Not all of the transition metal superconducting alloys lend themselves to the processing temperatures and times utilized in the fabrication of the Example I prototype. For example, Laves phase materials like $V_2(Hf_{0.5}Zr_{0.5})$ generally form at temperatures above 900° C., well in excess of the 650° C. of Example I. That temperatures and times may need to be varied in order to form certain of the alloys implicitly covered by the invention in no way impacts the invention itself. A knowledge of diffusion within transition metal systems is necessary in order to apply the invention. Given that knowledge, it is a trivial matter to adjust the processing parameters as is appropriate for a particular system in order to take advantage of the invention.

We claim:

1. A method for producing a superconductor comprising the steps of combining a plurality of metal bodies to form a composite structure, said metal bodies being selected from transition metals such as niobium, tantalum, titanium, zirconium, hafnium and vanadium, alternate bodies being formed of different transition metals to form triplets, reacting the transition metals to form a ductile superconducting ternary alloy at the interfaces of these triplets of metals, limiting the extent of the reaction so as to maintain areas of pure or nearly pure transition metal along with the superconducting ternary alloy in at least one of each said triplet of transition metals, mechanically reducing the composite structure and providing further diffusion to produce a superconductive layer in contact with a non superconducting layer in each said triplet, each said layer being less than 1000 Å thick.

2. A superconducting wire made by the process of claim 1.

3. The process of claim 1 wherein the three transition metals are Nb, Ta and Ti, the tantalum layer being positioned between the Nb and Ti layers and being less than half as thick as each of the other two layers.

4. The process of claim 1 wherein the three transition metals are Nb, Ta and Ti, the Ti being positioned between the Nb and Ta.

5. The process of claim 4 wherein an additional layer of Ti is on the second side of the Ta layer.

6. A method for producing a superconductor comprising the steps of producing a composite structure from a plurality of different metal bodies, said metal bodies including at least three transition metals such as niobium, titanium, tantalum, zirconium, vanadium, and hafnium, triplets of said different bodies providing a metal-to-metal bond, reacting the transition metals to form a ductile superconducting ternary alloy at the interfaces of these triplets of metals, limiting the extent of the reaction so as to maintain areas of pure or nearly pure transition metal along with the superconducting alloy in at least one of each said triplet of transition metals, and mechanically reducing the composite structure and providing further diffusion to produce a superconductor layer in contact with a non superconducting layer in each said triplet, each said layer being less than 1000 Å thick.

7. A superconducting wire made by the process of claim 6.

* * * * *

UNITED STATES PATENT AND TRADEMARK OFFICE
CERTIFICATE OF CORRECTION

PATENT NO. : 5,160,550

DATED : NOVEMBER 3, 1992

INVENTOR(S) : JAMES WONG and MARK K. RUDZIAK

It is certified that error appears in the above-identified patent and that said Letters Patent is hereby corrected as shown below:

"Claim 6, Col. 4, Line 51, after "providing", insert --metallic interfaces, compacting said interfaces to provide--."

Signed and Sealed this

Twenty-eighth Day of June, 1994

Attest:

BRUCE LEHMAN

Attesting Officer

Commissioner of Patents and Trademarks